US012100576B2

(12) United States Patent
Nguyen et al.

(10) Patent No.: US 12,100,576 B2
(45) Date of Patent: Sep. 24, 2024

(54) METAL OXIDE PRECLEAN CHAMBER WITH IMPROVED SELECTIVITY AND FLOW CONDUCTANCE

(71) Applicant: APPLIED MATERIALS, INC., Santa Clara, CA (US)

(72) Inventors: Andrew Nguyen, San Jose, CA (US); Xue Yang Chang, San Jose, CA (US); Yu Lei, Belmont, CA (US); Xianmin Tang, San Jose, CA (US); John C. Forster, Mountain View, CA (US); Yogananda Sarode Vishwanath, Bangalore (IN); Abilash Sainath, Bengaluru (IN); Tza-Jing Gung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 681 days.

(21) Appl. No.: 16/863,541

(22) Filed: Apr. 30, 2020

(65) Prior Publication Data
US 2021/0343508 A1    Nov. 4, 2021

(51) Int. Cl.
*H01J 37/32*    (2006.01)
*C23C 16/44*    (2006.01)

(52) U.S. Cl.
CPC .... *H01J 37/32477* (2013.01); *C23C 16/4412* (2013.01); *H01J 37/3244* (2013.01);
(Continued)

(58) Field of Classification Search
CPC ............ C23C 16/4404; C23C 16/4405; C23C 16/4412; C23C 16/45591; C23C 16/4585;
(Continued)

(56) References Cited

U.S. PATENT DOCUMENTS

| 5,919,332 | A | * | 7/1999 | Koshiishi | .......... | H01J 37/32082 |
|   |   |   |   |   |   | 156/345.47 |
| 8,075,728 | B2 | * | 12/2011 | Balakrishna | ........ | H01J 37/3244 |
|   |   |   |   |   |   | 118/715 |

(Continued)

OTHER PUBLICATIONS

International Search Report for PCT/US2021/030021. dated Aug. 17, 2021.

*Primary Examiner* — Benjamin Kendall
(74) *Attorney, Agent, or Firm* — Moser Taboa

(57) ABSTRACT

Embodiments of process kits for use in a process chamber are provided herein. In some embodiments, a process kit for use in a process chamber includes: a chamber liner having a tubular body with an upper portion and a lower portion; a confinement plate coupled to the lower portion of the chamber liner and extending radially inward from the chamber liner, wherein the confinement plate includes a plurality of slots; a shield ring disposed within the chamber liner and movable between the upper portion of the chamber liner and the lower portion of the chamber liner; and a plurality of ground straps coupled to the shield ring at a first end of each ground strap of the plurality of ground straps and to the confinement plate at a second end of each ground strap to maintain electrical connection between the shield ring and the chamber liner when the shield ring moves.

20 Claims, 6 Drawing Sheets

(52) U.S. Cl.
CPC .. *H01J 37/32495* (2013.01); *H01J 37/32633* (2013.01); *H01J 37/32651* (2013.01)

(58) Field of Classification Search
CPC ............. H01J 37/3244; H01J 37/32477; H01J 37/32495; H01J 37/32633; H01J 37/32642; H01J 37/32651
See application file for complete search history.

(56) References Cited

U.S. PATENT DOCUMENTS

| | | | |
|---|---|---|---|
| 8,435,379 B2 | 5/2013 | Mehta et al. | |
| 8,440,019 B2 | 5/2013 | Carducci et al. | |
| 9,032,906 B2 | 5/2015 | Ma et al. | |
| 9,865,437 B2 | 1/2018 | Chia et al. | |
| 10,276,405 B2 * | 4/2019 | Miyata | H01J 37/32834 |
| 2001/0000104 A1 * | 4/2001 | Li | H01J 37/32165 |
| | | | 216/67 |
| 2003/0029568 A1 * | 2/2003 | Brown | H01L 21/67069 |
| | | | 156/345.52 |
| 2004/0072426 A1 * | 4/2004 | Jung | H01J 37/32642 |
| | | | 438/689 |
| 2004/0182833 A1 * | 9/2004 | Fink | H01J 37/32082 |
| | | | 219/121.43 |
| 2006/0100825 A1 * | 5/2006 | Furuya | H01L 21/67288 |
| | | | 702/185 |
| 2009/0200269 A1 * | 8/2009 | Kadkhodayan | H01L 21/02104 |
| | | | 427/523 |
| 2009/0280040 A1 * | 11/2009 | Park | H01J 37/32623 |
| | | | 422/186.05 |
| 2011/0226181 A1 * | 9/2011 | Yamamoto | C23C 16/16 |
| | | | 118/724 |
| 2012/0322270 A1 | 12/2012 | Long et al. | |
| 2013/0133833 A1 | 5/2013 | Carman et al. | |
| 2014/0262763 A1 | 9/2014 | Rasheed et al. | |
| 2016/0093473 A1 | 3/2016 | Moon et al. | |
| 2017/0271129 A1 | 9/2017 | Carducci et al. | |

* cited by examiner

METAL OXIDE PRECLEAN CHAMBER WITH IMPROVED SELECTIVITY AND FLOW CONDUCTANCE

FIELD

Embodiments of the present disclosure generally relate to a substrate processing equipment.

BACKGROUND

Process chambers configured to perform a preclean process are known. For example, such chambers are configured to remove native oxide on metal contact pads of a substrate prior to physical vapor deposition (PVD) for depositing one or more barrier layers, e.g., titanium (Ti), copper (Cu), etc., on the substrate and to remove other materials. Preclean chambers, typically, use ion bombardment (induced by RF plasma) to remove the native oxide on the metal contact pads and other materials. For example, the preclean process can etch the native oxide and material from the substrate. The preclean process is configured to lower contact resistance between the metal contacts on the substrate to enhance performance and power consumption of integrated circuits on the substrate and to promote adhesion.

To perform a plasma cleaning process, an integrated circuit is placed in a plasma chamber and a pump removes most of the air from the chamber. Electromagnetic energy (e.g., radio frequency) is applied to an injected gas, such as argon, to excite the injected gas into a plasma state. The plasma releases ions that bombard the surface of the substrate to remove contaminants and/or material from the substrate. Atoms or molecules of the contaminants and/or substrate material are etched from the substrate and are, for the most part, pumped out of the chamber. However, some of the contaminant and/or etched material may be deposited on surfaces of the chamber. Process kits are typically used to reduce or prevent deposition of contaminants and/or etched materials onto surfaces of the chamber. However, for certain plasma cleaning or etching processes having increased contaminants or etched material, a process kit may not provide adequate flow conductance or flow equalization for removing displaced materials.

Accordingly, the inventors have provided embodiments of improved process chambers having improved process kits disposed therein.

SUMMARY

Embodiments of process kits for use in a process chamber are provided herein. In some embodiments, a process kit for use in a process chamber includes: a chamber liner having a tubular body with an upper portion and a lower portion; a confinement plate coupled to the lower portion of the chamber liner and extending radially inward from the chamber liner, wherein the confinement plate includes a plurality of slots; a shield ring disposed within the chamber liner and movable between the upper portion of the chamber liner and the lower portion of the chamber liner; and a plurality of ground straps coupled to the shield ring at a first end of each ground strap of the plurality of ground straps and to the confinement plate at a second end of each ground strap to maintain electrical connection between the shield ring and the chamber liner when the shield ring moves.

In some embodiments, a process kit for use in a process chamber includes: a chamber liner having a tubular body with an upper portion and a lower portion; a confinement plate coupled to the lower portion of the chamber liner and extending radially inward from the chamber liner, wherein the confinement plate includes an inner portion having a plurality of inner radial slots and an outer portion having a plurality of outer radial slots, wherein the plurality of outer radial slots have lengths that vary; a shield ring disposed within the chamber liner and movable between the upper portion of the chamber liner and the lower portion of the chamber liner; and a plurality of ground straps that are coupled to the shield ring at a first end and the confinement plate at a second end to maintain electrical connection between the shield ring and the chamber liner when the shield ring moves.

In some embodiments, a process chamber includes: a chamber body having an interior volume therein; a showerhead disposed in the interior volume to provide a process gas to the interior volume; a substrate support disposed in the interior volume opposite the showerhead to support a substrate, wherein the substrate support is configured to move vertically from a first position to a second position, wherein the second position is closer to the showerhead than the first position; a chamber liner coupled to the chamber body and disposed about the substrate support; a confinement plate coupled to the chamber liner; a shield ring coupled to the substrate support and movable with the substrate support, wherein the shield ring is disposed between the confinement plate and the substrate support; and a plurality of ground straps that are coupled to the shield ring at a first end and the confinement plate at a second end to maintain electrical connection between the substrate support and the chamber liner while the substrate support is in the first position and the second position.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits for use in a process chamber are provided herein. The process chamber may be configured to perform any suitable process to a substrate, for example, an etch process, a deposition process, or a preclean process. In some embodiments, the process chamber is a metal oxide preclean chamber. The process chamber may be configured to selectively operate at a variety of pressure ranges so that a single process chamber may be used to perform multiple steps of a preclean process. For example, the process chamber may operate at pressures lower than 100 mTorr or as high as 30 Torr. In some embodiments, a first step may be performed in the process chamber, a second step may be performed in a second process chamber, and a third step may be performed in the same process chamber as the first step. The first step, for example, may be a low-pressure hydrogen preclean process. The third step, for example, may be a high-pressure hydrogen preclean process.

Chamber components disposed in the process chamber advantageously facilitate rapid pump down and return to higher processing pressure to enable more rapid switching between high-pressure and low-pressure processes. Chamber components may be arranged in different configurations depending on whether a high-pressure or a low-pressure process is being performed. For example, during a low-pressure process, a substrate support disposed in the process chamber may be further from a showerhead than during a high-pressure process. The embodiments of the process chamber provided herein advantageously provide continuous RF grounding while the substrate support moves vertically with respect to the showerhead, avoiding mechanical rubbing and particle generation. The process chamber may be a stand-alone chamber or part of a multi-chamber processing tool.

Figure 1:
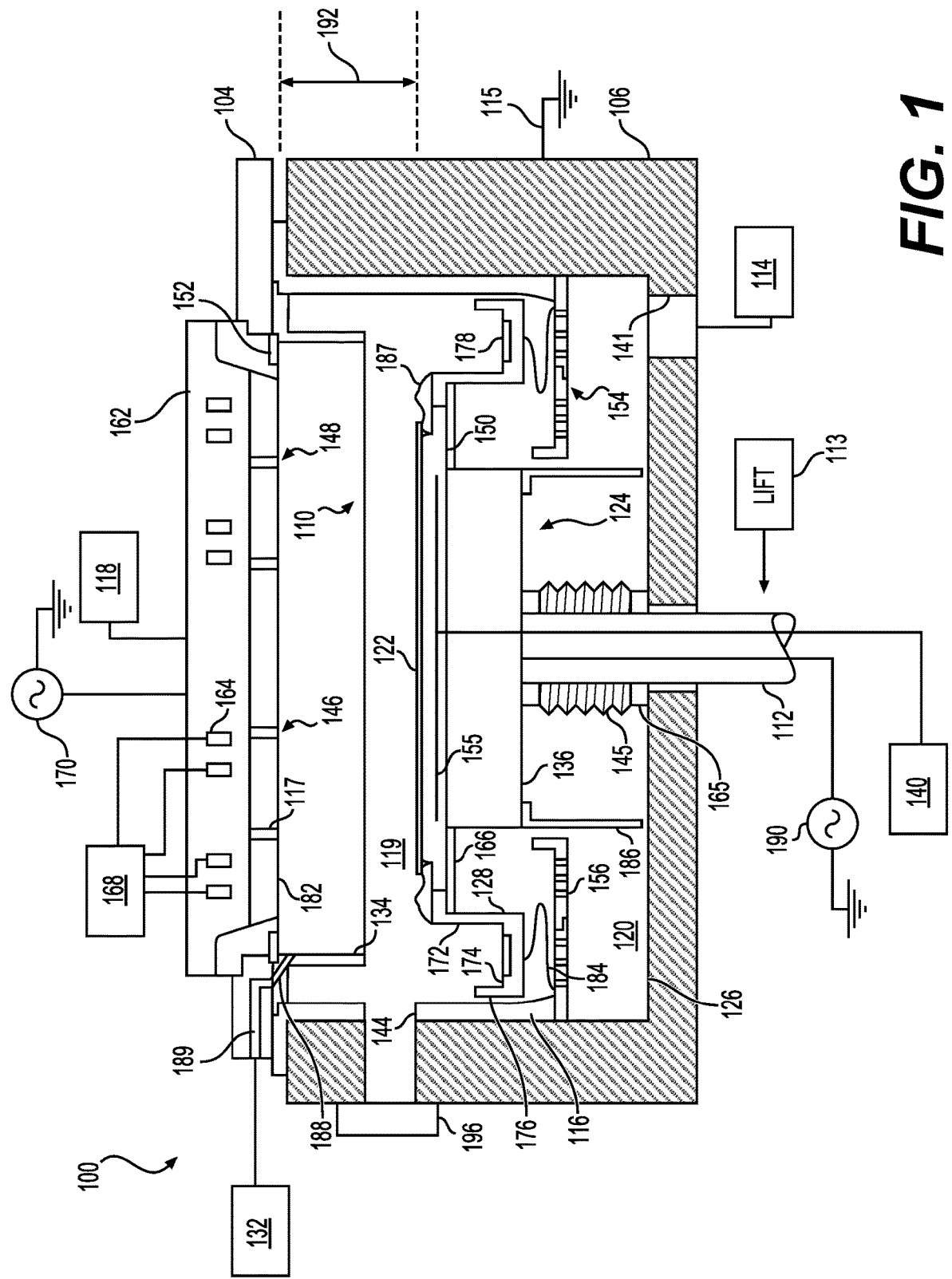
FIG. 1 is a schematic side view of a process chamber in a first position in accordance with some embodiments of the present disclosure.
Figure 2:
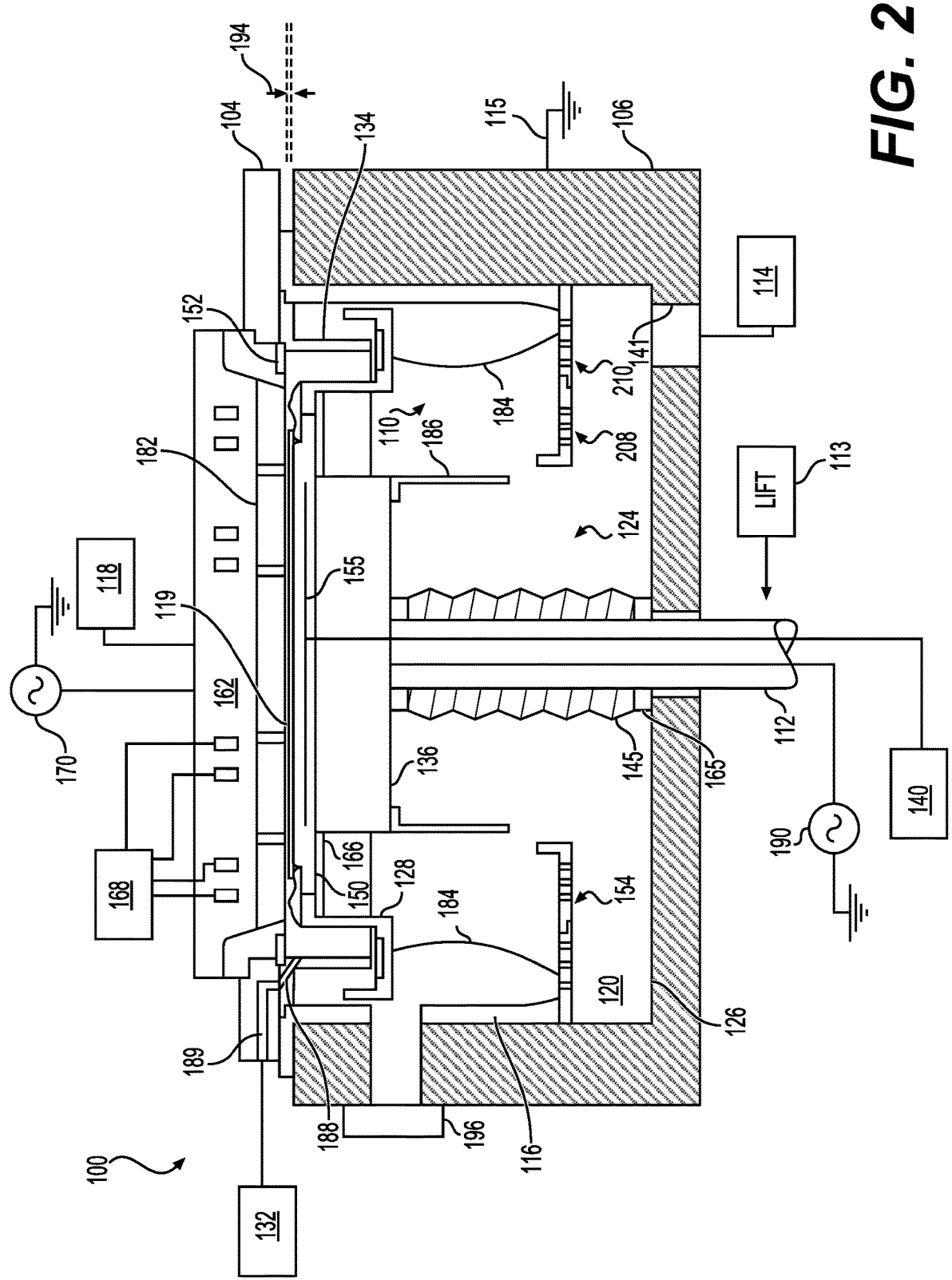
FIG. 2 is a schematic side view of a process chamber in a second position in accordance with some embodiments of the present disclosure.

FIG. 1 is a schematic side view of a process chamber 100 (e.g., a plasma processing chamber) with a substrate support 124 in a first position in accordance with some embodiments of the present disclosure. FIG. 2 is a schematic side view of the process chamber 100 with the substrate support 124 in a second position in accordance with some embodiments of the present disclosure. In some embodiments, the process chamber 100 is a preclean process chamber. However, other types of process chambers configured for different processes can also use or be modified for use with embodiments of the process kit described herein. In some embodiments, the first position corresponds with a configuration to perform a low-pressure process. In some embodiments, the second position corresponds with a configuration to perform a high-pressure process.

The process chamber 100 is a vacuum chamber which is suitably adapted to maintain sub-atmospheric pressures within an interior volume 120 during substrate processing. In some embodiments, the process chamber 100 can maintain a pressure of about 1 mTorr to about 30 Torr. The process chamber 100 includes a chamber body 106 covered by a lid 104 which encloses a processing volume 119 located in the upper half of the interior volume 120. In some embodiments, the process chamber 100 may include an adapter (not shown) disposed between the chamber body 106 and the lid 104 and resting on sidewalls of the chamber body 106. An RF power supply 170 may be coupled to the process chamber 100 to provide RF power to the process chamber 100. In some embodiments, RF energy supplied by the RF power supply 170 may have a frequency of about 10 MHz or greater or 35 MHz or greater. The process chamber 100 includes a process kit 110 circumscribing various chamber components to prevent unwanted reaction between such components and etched material and other contaminants. The chamber body 106, the adapter 180, and the lid 104 may be made of metal, such as aluminum. The chamber body 106 may be grounded via a coupling to ground 115.

The process chamber 100 is coupled to and in fluid communication with a process gas supply 118 which may supply one or more process gases to the process chamber 100 for processing a substrate disposed therein. In some embodiments, the lid 104 includes a port through which gas from the process gas supply 118 can be introduced into the interior volume 120. In some embodiments, the process gas supply 118 provides hydrogen gas. In some embodiments, a showerhead 182 is coupled to the lid 104 and disposed in the interior volume 120 to inject gas from the process gas supply 118 into the processing volume 119 via a plurality of openings 117. In some embodiments, the showerhead 182 is a multi-zone showerhead configured to inject gas into the processing volume 119 at different temperatures by zone. For example, the showerhead 182 may include a first zone 146 and a second zone 148. In some embodiments, the first zone 146 is radially inward of the second zone 148.

In some embodiments, a chill plate 162 is coupled to the showerhead 182 to facilitate temperature control of the one or more zones of the showerhead 182. The chill plate 162 includes a plurality of cooling channels 164 therethrough. The plurality of cooling channels 164 may be arranged in fluidly independent sets corresponding with the zones of the showerhead 182. A cooler 168 is coupled to the plurality of cooling channels 164 and configured to circulate a coolant therethrough. In some embodiments, the cooler 168 provides a supply line and a return line to each respective set of the plurality of cooling channels 164.

The substrate support 124 is disposed within the interior volume 120 opposite the showerhead 182 to support and retain a substrate 122, such as a semiconductor wafer, for example, or other such substrate as may be electrostatically retained. The substrate support 124 may generally comprise a pedestal 136 and a hollow support shaft 112 for supporting the pedestal 136. The pedestal 136 includes an electrostatic chuck 150 having one or more electrodes 155 embedded therein. The electrostatic chuck 150 may be heated to temperatures up to about 400 deg Celsius. In some embodiments, the electrostatic chuck 150 comprises a dielectric plate. The hollow support shaft 112 provides a conduit to provide, for example, backside gases, process gases, fluids, coolants, power, or the like, to the electrostatic chuck 150. In some embodiments, the substrate support 124 includes an edge ring 187 disposed about the electrostatic chuck 150. In some embodiments, the edge ring 187 is made of alumina ($Al_2O_3$). A slit valve 196 may be coupled to the chamber body 106 to facilitate transferring the substrate 122 into and out of the interior volume 120.

In some embodiments, the hollow support shaft 112 is coupled to a lift mechanism 113, such as an actuator or motor, which provides vertical movement of the electrostatic chuck 150 to one or more processing positions and a transfer position for transferring the substrate 122 into or out of the process chamber 100. For example, the lift mechanism 113 may move the substrate support 124 in the first position (as shown in FIG. 1) and move the substrate support 124 in the second position (as shown in FIG. 2) depending on whether a high-pressure or a low-pressure process is being performed. In some embodiments, in the first position, the substrate support 124 is disposed a first distance 192 from the showerhead 182. In some embodiments, the first distance 192 is about 3.0 inches to about 5.0 inches. The first position may be used, for example, during a low-pressure process. In some embodiments, in the second position, the substrate support 124 is disposed a second distance 194 from the showerhead 182. In some embodiments, the second distance 194 is about 0.2 inches to about 1.0 inches. The smaller distance between the substrate support 124 and the showerhead 182 in the second position corresponds with a smaller processing volume 119, which facilitates conducting high pressure processes in the process chamber 100. For example, the smaller distance between the substrate support 124 and the showerhead 182 in the second position advantageously facilitates rapid return to higher processing pressure to enable more rapid switching between high-pressure and low-pressure processes.

A bellows assembly 145 is disposed about the hollow support shaft 112 and is coupled between the electrostatic chuck 150 and a bottom surface 126 of process chamber 100 to provide a flexible seal that allows vertical motion of the electrostatic chuck 150 while reducing or preventing loss of vacuum from within the process chamber 100. The bellows assembly 145 also includes a lower bellows flange 165 in contact with an o-ring or other suitable sealing element which contacts the bottom surface 126 to help prevent loss of chamber vacuum.

The hollow support shaft 112 provides a conduit for coupling a backside gas supply, a chucking power supply 140, heater power supply, and a bias RF power supply 190 to the electrostatic chuck 150. In some embodiments, the chucking power supply 140 provides DC power to the electrostatic chuck 150 to retain the substrate 122. In some embodiments, RF energy supplied by the bias RF power supply 190 may have a frequency of about 10 MHz or greater. In some embodiments, the bias RF power supply 190 may have a frequency of about 13.56 MHz.

The process chamber 100 is coupled to and in fluid communication with a vacuum system 114 which includes a throttle valve (not shown) and pump (not shown) which are used to exhaust the process chamber 100. In some embodiments, the vacuum system 114 is coupled to a pump port 141 disposed on the bottom surface 126 of the chamber body 106. In some embodiments, the pump port 141 is located on one side of the substrate support 124. The pressure inside the process chamber 100 may be regulated by adjusting the throttle valve and/or vacuum pump. In some embodiments, the pump has a flow rate of about 1900 liters per second to about 3000 liters per second.

In operation, for example, a plasma may be created in the processing volume 119 to perform one or more processes. The plasma may be created by coupling power from a plasma power source (e.g., RF power supply 170 or Bias RF power supply 190) to a process gas to ignite the process gas and create the plasma. Depending on the process, the bias RF power supply 190 may or may not be used to attract ions from the plasma towards the substrate 122.

In some embodiments, the process kit 110 includes a chamber liner 116 (described in more detail below) coupled to the chamber body 106 to protect an inner surface of the chamber body 106 from unwanted deposition. The chamber liner 116 is disposed about the substrate support 124. In some embodiments, the chamber liner 116 is sized to surround the pedestal 136 when the substrate support 124 is in the first position and the second position. The chamber liner 116 includes an opening 144 aligned with an opening in the chamber body 106 and a slit valve 196 coupled to the chamber body 106 to facilitate moving the substrate 122 into and out of the interior volume 120.

In some embodiments, the process kit 110 includes a plasma confinement ring 134 coupled to the lid 104 and disposed proximate the showerhead 182 to confine a plasma therein. The plasma confinement ring 134 generally comprises a tubular body and an upper flange extending radially outward form an upper surface of the tubular body. In some embodiments, the plasma confinement ring 134 is disposed within the chamber liner 116. In some embodiments, the plasma confinement ring 134 is coupled to or rests on the chamber liner 116. In some embodiments, the upper flange of the plasma confinement ring 134 rests on an upper inner notch of the chamber liner 116. The plasma confinement ring 134 may be made of a metal, for example, aluminum.

In some embodiments, the plasma confinement ring 134 includes a channel 188 extending therethrough and coupled to a pressure probe 132 to facilitate a direct pressure measurement within the processing volume 119. In some embodiments, the channel 188 extends from a top surface of the plasma confinement ring 134 to an inner surface of the plasma confinement ring 134. In some embodiments, the channel 188 is coupled to the pressure probe 132 via a channel 189 in the lid 104. The pressure probe 132 may be any suitable pressure measurement device, such as a manometer.

In some embodiments, the process kit 110 includes a top liner ring 152 is disposed between the plasma confinement ring 134 and the showerhead 182 to reduce or prevent plasma leak therebetween. In some embodiments, the top liner ring 152 rests in an upper inner notch of the plasma confinement ring 134 such that an inner diameter of the plasma confinement ring 134 is less than an outer diameter of the top liner ring 152 and greater than an inner diameter of the top liner ring 152. In some embodiments, the top liner ring 152 is made of a ceramic material, for example, aluminum oxide ($Al_2O_3$). In some embodiments, the top liner ring 152 has a thickness of about 0.1 to about 0.3 inches.

In some embodiments, the process kit 110 includes a confinement plate 154 (described in more detail below) coupled to the chamber liner 116. In some embodiments, the confinement plate 154 is coupled to a lower portion of the chamber liner 116 and extends radially inward from the chamber liner 116. The confinement plate 154 includes a plurality of slots 156 to provide a gas flow path from the processing volume 119 to the pump port 141. In some embodiments, the confinement plate 154 includes an inner plate 208 coupled to an outer plate 210.

In some embodiments, the process kit 110 includes a shield ring 128 coupled to the substrate support 124 and movable with the substrate support 124. For example, the shield ring 128 may be coupled to a ground bracket 166 of the pedestal 136. In some embodiments, the shield ring 128 is movable between the upper portion of the chamber liner 116 and the lower portion of the chamber liner 116. The shield ring 128 is disposed between the confinement plate 154 and the substrate support 124. In some embodiments, the shield ring 128 includes an inner wall 172 extending downwards from the electrostatic chuck 150, a ledge 174 extending radially outward from the inner wall 172, and an outer wall 176 extending upward from the ledge 174.

A plurality of ground straps 184 are coupled to the shield ring 128. In some embodiments, a shield ring cover 178 made of a ceramic material is disposed on the ledge 174 of the shield ring 128 to cover any exposed fasteners that are used to couple the shield ring 128 to the plurality of ground straps 184. The plurality of ground straps 184 are coupled to the confinement plate 154 to maintain electrical connection between the shield ring 128 and the chamber liner 116 via the confinement plate 154. The plurality of ground straps 184 are advantageously coupled to the confinement plate 154 as one end and the shield ring 128 at another end to maintain electrical connection between when the shield ring 128 moves, for example, from the first position to the second position. The ground straps 184 also provides continuous RF grounding without mechanical rubbing with other chamber components while the substrate support 124 moves vertically with respect to the showerhead 182, advantageously reducing unwanted particle generation.

A gas flow path extends from the processing volume 119 to around the shield ring 128 between the outer wall 176 of the shield ring 128 and an inner surface of the chamber liner 116. In some embodiments, the gas flow path extends around the shield ring 128 without extending through the shield ring 128. In some embodiments, when the shield ring 128 is in an upper position, for example the second position of the substrate support 124, the plasma confinement ring 134 extends between the inner wall 172 and the outer wall 176 to define a tortuous gas flow path therebetween. In some embodiments, when the shield ring 128 is in a lower position, for example, the first position of the substrate support 124, the plasma confinement ring 134 does not extend between the inner wall 172 and the outer wall 176.

In some embodiments, the process kit 110 includes a lower liner 186 coupled to the pedestal 136 and surrounding the hollow support shaft 112. In some embodiments, the lower liner 186 includes a tubular body with no through holes and an upper flange extending radially inward form the tubular body. In some embodiments, the upper flange of the lower liner 186 is fastened to a bottom surface of the pedestal 136 via a plurality of fasteners. The lower liner 186 is configured to direct a gas flow through the confinement plate 154 and reduce a gas flow between the confinement plate 154 and the bellows assembly 145. The lower liner 186 advantageously protects the bellows assembly 145 from gas flow from the processing volume 119 to the pump port 141.

In some embodiments, an outer diameter of the lower liner 186 is about 0.1 to about 0.5 inches less than an inner diameter of the confinement plate 154. In some embodiments, when the substrate support 124 is in the first position, the lower liner 186 is about 0.1 to about 1.0 inches from the bottom surface 126 of the chamber body 106. In some embodiments, when the substrate support 124 is in the second position, the lower liner 186 is about 0.3 to about 1.0 inches from an upper surface of the confinement plate 154.

Figure 3:
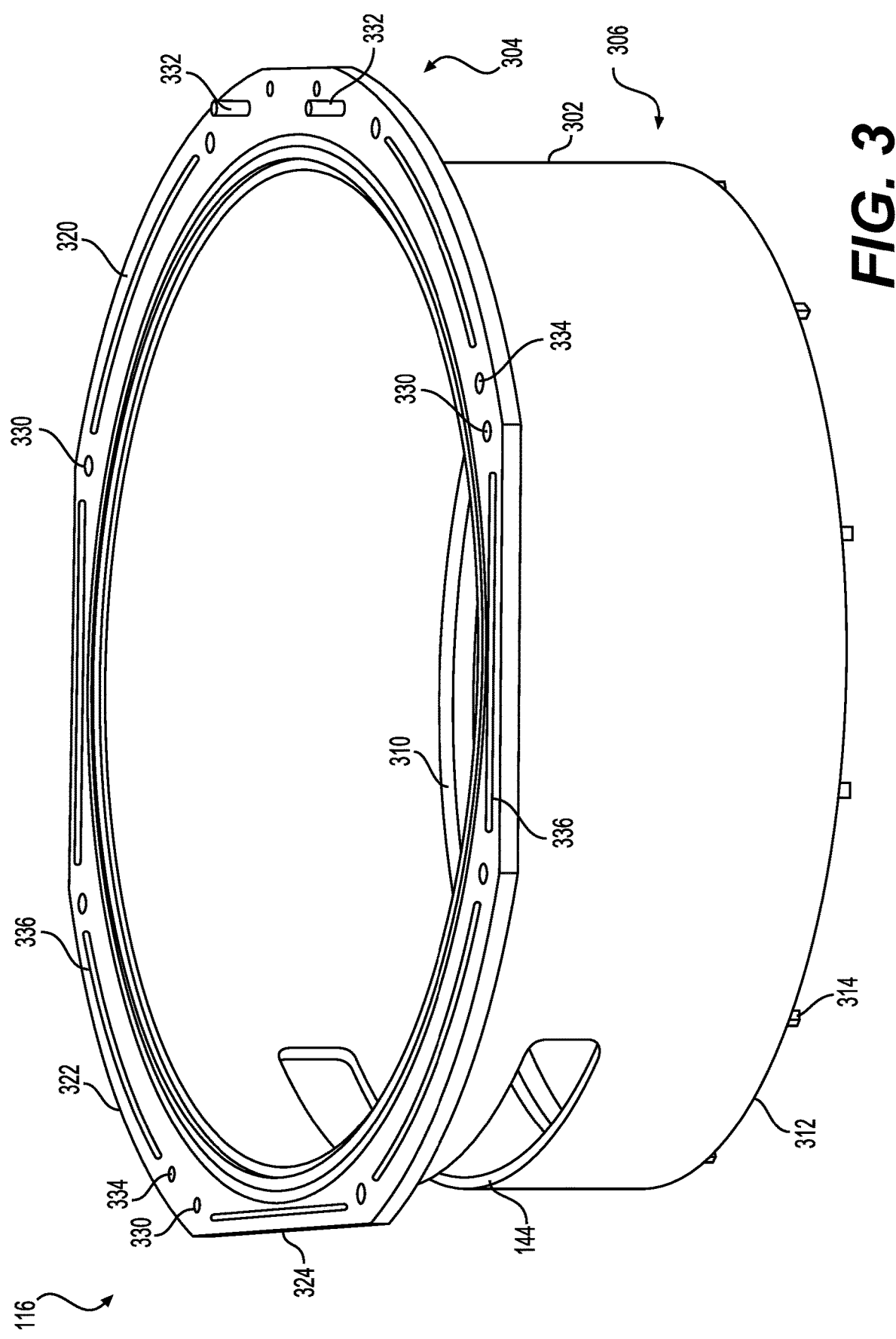
FIG. 3 is a top isometric view of a chamber liner in accordance with some embodiments of the present disclosure.

FIG. 3 is a top isometric view of a chamber liner 116 in accordance with some embodiments of the present disclosure. The chamber liner 116 includes a tubular body 302 with an upper portion 304 and a lower portion 306. The tubular body 302 does not have any holes except for the opening 144 for transferring the substrate 122. In some embodiments, the lower portion 306 includes a lower ledge 310 extending radially inward from a lower surface 312 of the lower portion 306. The lower surface 312 may include a plurality of openings to receive fasteners 314 for coupling the chamber liner 116 to the confinement plate 154.

In some embodiments, the upper portion 304 includes an upper flange 320 extending radially outward from the tubular body 302. In some embodiments, an outer surface of the upper flange 320 comprises a plurality of arc segments 322 and a plurality of linear segments 324. The upper flange 320 may include plurality of openings 330 for mounting the chamber liner 116 to the chamber body 106. In some embodiments, the upper flange 320 includes one or more guide pins 332 on an upper surface (two shown in FIG. 3) for aligning the chamber liner 116 to the lid 104. In some embodiments, the one or more guide pins 332 are disposed on one side of the chamber liner 116. The upper flange 320 may include one or more guide pins (not shown) on a lower surface for aligning the chamber liner 116 to the chamber body 106. In some embodiments, the upper flange 320 includes a plurality of openings 334 for mounting the lid 104 to the chamber liner 116.

The upper flange 320 may include a plurality of grooves 336 disposed between adjacent one of the plurality of openings 330 to accommodate gaskets to at least one of seal or enhance electrical connection between the lid 104 and the chamber liner 116 and/or the chamber body 106 and the chamber liner 116. In some embodiments, the plurality of grooves 336 disposed in the plurality of arc segments 322 have an arc shape and the plurality of grooves 336 disposed in the plurality of linear segments 324 have a linear shape.

Figure 4:
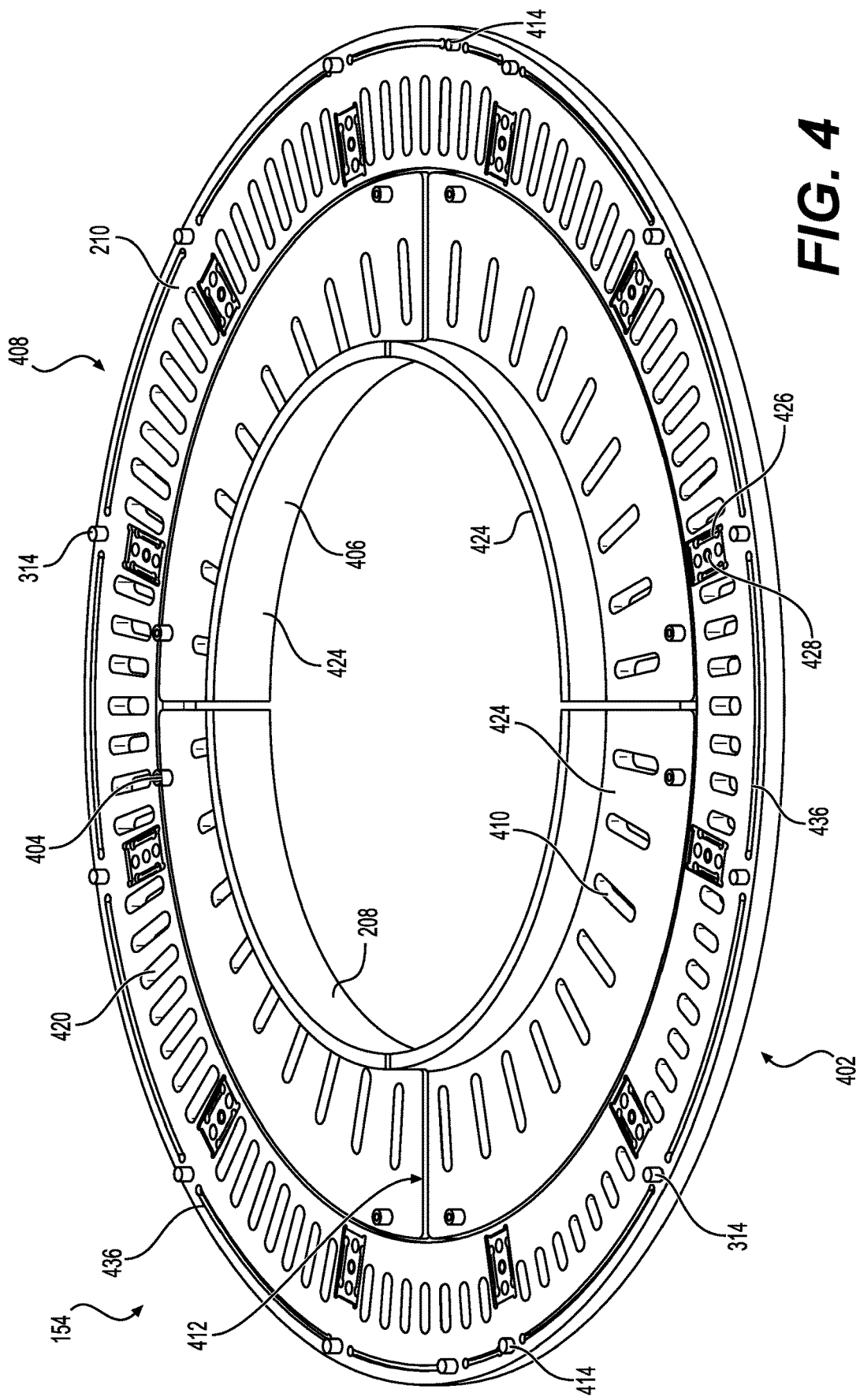
FIG. 4 is a top isometric view of a confinement plate in accordance with some embodiments of the present disclosure.

FIG. 4 is a top isometric view of a confinement plate 154 in accordance with some embodiments of the present disclosure. In some embodiments, the confinement plate 154 includes an inner plate 208 having an annular shape coupled to an outer plate 210 having an annular shape. In some embodiments, the inner plate 208 rests on an inner ledge of the outer plate 210. In some embodiments, the inner plate 208 is coupled to the outer plate 210 via a plurality of fasteners 404. In some embodiments, the plurality of fasteners 404 extend through the inner plate 208 and couple the inner plate 208 to the inner ledge of the outer plate 210. In some embodiments, the inner plate 208 includes an inner lip 406 extending upward from an inner edge of the inner plate 208 to help choke flow through the confinement plate 154. In some embodiments, the inner lip 406 extends about 0.3 to about 0.9 inches. The inner plate 208 and the outer plate 210 are generally made of a metal, for example, aluminum.

In some embodiments, the plurality of slots 156 of the confinement plate 154 includes a plurality of outer radial slots 420 disposed in the inner plate 208. The plurality outer radial slots 420 are size to reduce or prevent plasma leak therethrough. In some embodiments, the plurality of outer radial slots 420 have lengths that vary. For example, the plurality of outer radial slots 420 have lengths that are shorter on a first side 408 of the confinement plate 154 proximate the pump port 141 and lengths that are longer on a second side 402 of the confinement plate 154 away from the pump port 141 to advantageously provide more uniform flow through the confinement plate 154. In some embodiments, the plurality of outer radial slots 420 have a width that is uniform. In some embodiments, the width of each of the plurality of outer radial slots 420 is about 0.1 to about 0.4 inches.

In some embodiments, the plurality of slots 156 includes a plurality of inner radial slots 410 disposed in the inner plate 208. The plurality inner radial slots 410 are size to reduce or prevent plasma leak therethrough. In some embodiments, the plurality of inner radial slots 410 have lengths that are uniform. In some embodiments, the plurality of inner radial slots 410 have a width that is uniform. In some embodiments, the width of each of the plurality of inner radial slots 410 is about 0.1 to about 0.4 inches. In some embodiments, the width of each of the plurality of inner radial slots 410 is similar to the width of each of the plurality of outer radial slots 420. In some embodiments, a length of each one of the plurality of inner radial slots 410 is equal to or greater than a length of each one of the plurality of outer radial slots 420.

In some embodiments, the inner plate 208 is made of a single piece of material. In some embodiments, the inner plate 208 advantageously comprises a plurality of inner plate segments 424 for easy service and installation. In some embodiments, as shown in Figure, 4, the inner plate 208 comprises four inner plate segments 424 with a gap 412 therebetween. In some embodiments, the gap 412 is less than a width of each of the plurality of inner radial slots 410. The plurality of inner plate segments 424 are coupled to the outer plate 210.

In some embodiments, the outer plate 210 includes alignment pins 414 for aligning the outer plate 210 to the chamber liner 116. In some embodiments, the outer plate 210 includes a plurality of grooves 436 disposed at an interface between the outer plate 210 and the chamber liner 116. The plurality of grooves 436 are configured to house spring members such as RF gaskets to maintain and enhance electrical connection between the confinement plate 154 and the chamber liner 116. In some embodiments, each of the plurality of grooves 436 is disposed between adjacent ones of openings for the plurality of fasteners 314. In some embodiments, the alignment pins 414, the plurality of grooves 436, and openings for the fasteners 314 are disposed along a common diameter from a central axis of the outer plate 210.

In some embodiments, at least one of the inner plate 208 and the outer plate 210 include a plurality of strap recesses 426 to facilitate alignment and coupling of the plurality of ground straps 184 to the confinement plate 154. In some embodiments, as shown in FIG. 4, the plurality of strap recesses 426 are disposed on an upper surface of the outer plate 210 between sets of the plurality of outer radial slots 420. In some embodiments, each of the plurality of strap recesses 426 are disposed at regular intervals about the confinement plate 154. In some embodiments, each of the plurality of strap recesses 426 includes one or more openings 428.

Figure 5:
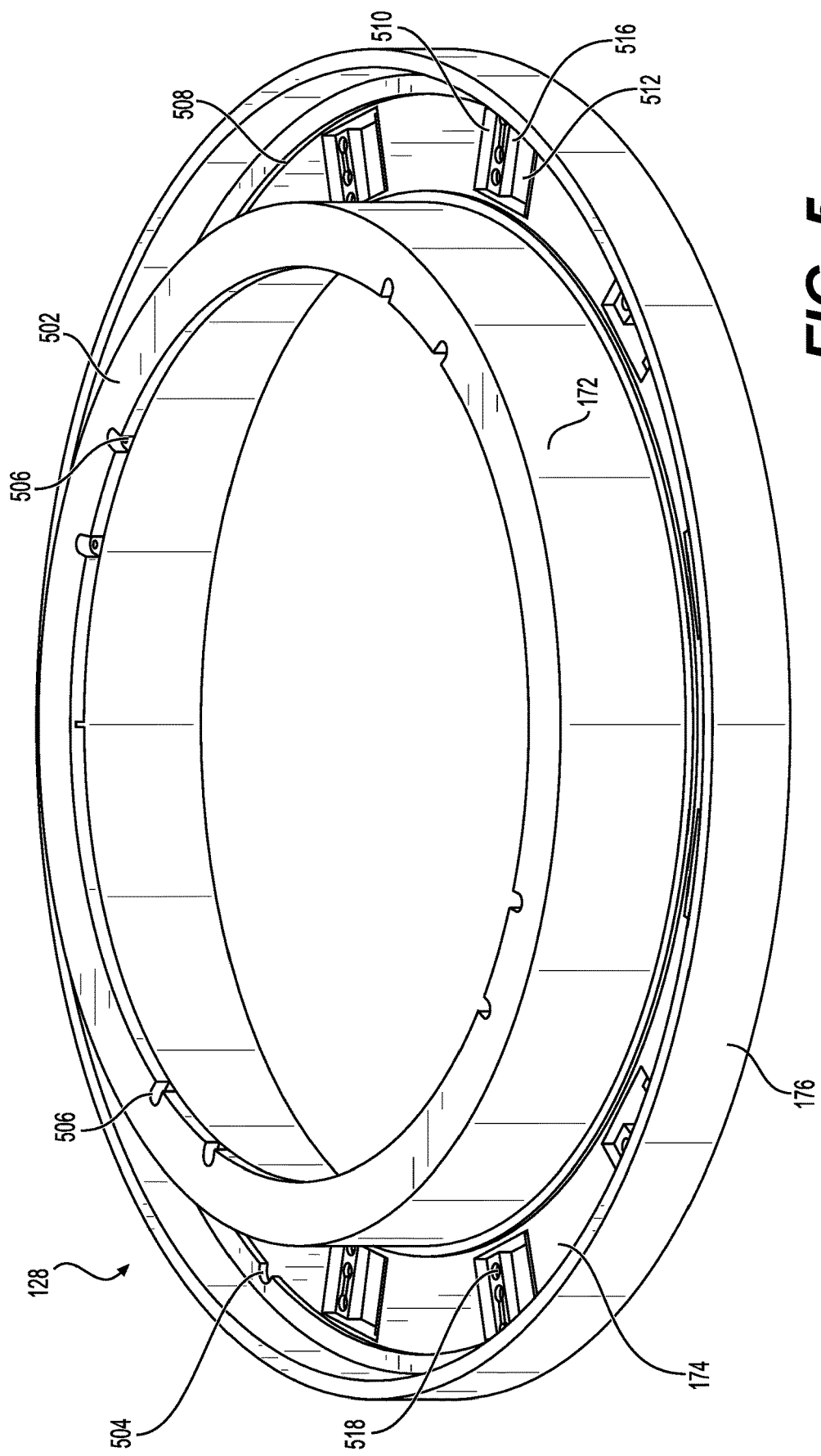
FIG. 5 is a top isometric view of a shield ring in accordance with some embodiments of the present disclosure.

FIG. 5 is a top isometric view of a shield ring 128 in accordance with some embodiments of the present disclosure. In some embodiments, the shield ring 128 includes an outer wall 176, a ledge 174 extending radially inward from the outer wall 176, an inner wall 172 extending upward from the ledge 174, and an upper flange 502 extending radially inward from the inner wall 172. In some embodiments, the edge ring 187 rests on the upper flange 502. In some embodiments, the upper flange 502 includes openings 506 to couple the shield ring 128 to the pedestal 136.

In some embodiments, the ledge 174 includes a plurality of recessed portions 510 to facilitate coupling the shield ring 128 to the plurality of ground straps 184. In some embodiments, the plurality of recessed portions 510 are arranged at regular intervals about the shield ring 128. In some embodiments, the plurality of recessed portions 510 are rectangular shaped, although they may be other shapes as well. In some embodiments, each of the plurality of recessed portions 510 include an opening 512 to allow one end of a ground strap of the plurality of ground straps 184 to pass through and to facilitate coupling the ground strap to the confinement plate 154. In some embodiments, each of the plurality of recessed portions 510 include an opening 512 and a pair of stepped surfaces 516 that are recessed from an upper surface of the ledge 174 on either side of the opening 512. In some embodiments, the each of the pair of stepped surfaces 516 include one or more openings 518 to facilitate coupling each ground strap to the shield ring 128. In some embodiments, the upper surface of the ledge 174 includes an annular groove 508 to accommodate the shield ring cover 178. The shield ring cover 178 is configured to cover fasteners or any other hardware used to couple the plurality of ground straps 184 to the shield ring 128, which could produce contaminants when exposed to plasma. In some embodiments, the ledge 174 includes one or more slots extending from the annular groove 508 for ease of install or removal of the shield ring cover 178.

Figure 6:
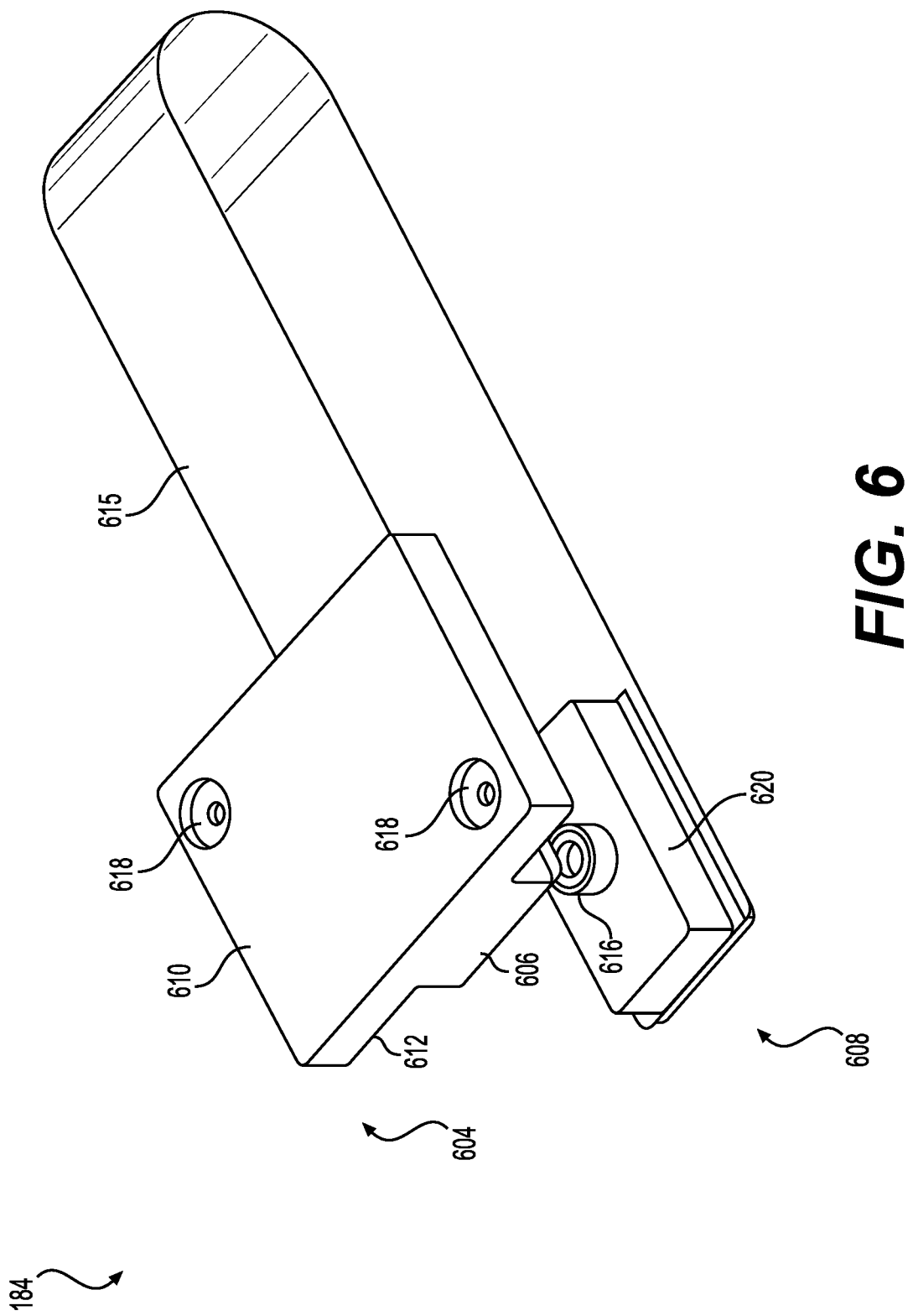
FIG. 6 is an isometric view of a ground strap in accordance with some embodiments of the present disclosure.

FIG. 6 is an isometric view of a ground strap of the plurality of ground straps 184 in accordance with some embodiments of the present disclosure. In some embodiments, the plurality of ground straps 184 are coupled to the shield ring 128 at a first end 604 of each ground strap of the plurality of ground straps 184 and to the confinement plate 154 at a second end 608 of each ground strap. The plurality of ground straps 184 are configured to maintain electrical connection between the shield ring 128 and the ground 115 via, the confinement plate 154, the chamber liner 116, and the chamber body 106.

In some embodiments, each one of the plurality of ground straps 184 includes an upper plate 610, a lower plate 620, and a metal strap 615 coupled to both the upper plate 610 and the lower plate 620. In some embodiments, the upper plate 601, the lower plate 620, and the metal strap 615 are made of stainless steel. In some embodiments, the metal strap 615 has a length of about 5.0 inches to about 9.0 inches to maintain electrical connection between the confinement plate 154 and the shield ring 128 in both the first position and the second position.

In some embodiments, the lower plate 620 is smaller than the upper plate 610. In some embodiments, the lower plate 620 is smaller than the opening 512 in the shield ring 128 to allow the lower plate 620 to pass therethrough so that the lower plate 620 may be coupled to the confinement plate 154. In some embodiments, the lower plate 620 has a width less than a width of the metal strap 615. In some embodiments, a fastener 616 extends through the lower plate 620 and the metal strap 615 into one of the openings 428 of the confinement plate 154 to couple the confinement plate 154 to the lower plate 620.

In some embodiments, the upper plate 610 is size to extend into one of the plurality of recessed portions 510 of the shield ring 128. In some embodiments, the upper plate 610 includes a central portion 606 that is configured to extend into the opening 512 of each of the plurality of recessed portions 510. In some embodiments, the upper plate 610 includes stepped portions 612 on either side of the central portion 606 configured to rest on the pair of stepped surfaces 516 of each of the plurality of recessed portions 510 of the shield ring 128. In some embodiments, fasteners 618 extend through the stepped portions 612 of the upper plate 610 and into openings 518 of the shield ring 128 to couple the upper plate 610 to the shield ring 128.

While the foregoing is directed to embodiments of the present disclosure, other and further embodiments of the disclosure may be devised without departing from the basic scope thereof.

The invention claimed is:

1. A process kit for use in a process chamber, comprising:
   a chamber liner having a tubular body with an upper portion and a lower portion;
   a confinement plate coupled to the lower portion of the chamber liner and extending radially inward from the chamber liner, wherein the confinement plate includes a central opening and a plurality of slots disposed about the central opening;
   a shield ring disposed within the chamber liner and movable between the upper portion of the chamber liner and the lower portion of the chamber liner, wherein the shield ring is movably disposed over the confinement plate, and wherein a diameter of a central opening of the shield ring is greater than a diameter of the central opening of the confinement plate; and a plurality of ground straps coupled to the shield ring at a first end of each ground strap of the plurality of ground straps and to the confinement plate at a second end of each ground strap to maintain electrical connection between the shield ring and the chamber liner when the shield ring moves.

2. The process kit of claim 1, wherein the confinement plate includes an inner plate coupled to an outer plate, wherein the plurality of slots includes a plurality of inner radial slots disposed in the inner plate and a plurality of outer radial slots disposed in the outer plate, and wherein the outer plate includes a plurality of strap recesses and the plurality of ground straps are coupled to the outer plate at the plurality of strap recesses.

3. The process kit of claim 2, wherein a length of each one of the plurality of inner radial slots is greater than a length of each one of the plurality of outer radial slots.

4. The process kit of claim 2, wherein the inner plate comprises a plurality of inner plate segments that are coupled to the outer plate.

5. The process kit of claim 1, wherein the confinement plate includes an inner plate coupled to an outer plate, and wherein the inner plate includes an inner lip extending upward from an inner edge of the inner plate.

6. The process kit of claim 1, wherein each one of the plurality of ground straps includes an upper plate, a lower plate, and a metal strap therebetween.

7. The process kit of claim 6, wherein the upper plate is coupled to the shield ring and the lower plate is coupled to the confinement plate.

8. The process kit of claim 1, wherein the shield ring includes an inner wall, an upper flange extending radially inward from the inner wall and defining a radially innermost surface of the shield ring, a ledge extending radially outward from the inner wall, and an outer wall extending upward from the ledge, wherein a gas flow path extends around the shield ring between the outer wall of the shield ring and the chamber liner, without extending through the shield ring.

9. The process kit of claim 8, wherein the ledge includes ground strap openings for coupling the shield ring to the plurality of ground straps, and further comprising a shield ring cover made of a ceramic material disposed on the ledge of the shield ring to cover the ground strap openings.

10. A process kit for use in a process chamber, comprising:
a chamber liner having a tubular body with an upper portion and a lower portion;
a confinement plate coupled to and disposed below the lower portion of the chamber liner and extending radially inward from the chamber liner, wherein the confinement plate includes an inner portion having a plurality of inner radial slots and an outer portion having a plurality of outer radial slots, wherein the plurality of outer radial slots have lengths that vary, and wherein the inner portion includes an inner lip extending upward from an inner edge of the inner portion;
a shield ring disposed within the chamber liner and movable between the upper portion of the chamber liner and the lower portion of the chamber liner, wherein the shield ring is movably disposed over the confinement plate, wherein a diameter of a central opening of the shield ring is greater than a diameter of a central opening of the confinement plate; and a plurality of ground straps that are coupled to the shield ring at a first end and the confinement plate at a second end to maintain electrical connection between the shield ring and the chamber liner when the shield ring moves.

11. The process kit of claim 10, further comprising a plasma confinement ring coupled to or resting on the upper portion of the chamber liner, wherein the plasma confinement ring and the shield ring are configured to define a tortuous gas flow path therebetween.

12. The process kit of claim 11, wherein the plasma confinement ring includes a tubular body and an upper flange extending radially outward from an upper surface of the tubular body, and wherein the upper flange rests on an upper inner notch of the chamber liner.

13. The process kit of claim 11, wherein the shield ring includes an inner wall and an outer wall, and wherein when the shield ring is in an upper position, the plasma confinement ring extends between the inner wall and the outer wall and when the shield ring is in a lower position, the plasma confinement ring does not extend between the inner wall and the outer wall.

14. The process kit of claim 10, wherein the shield ring includes an inner wall, a ledge extending radially outward from the inner wall, and an outer wall extending upward from the ledge, wherein the ledge includes a plurality of openings to facilitate coupling the shield ring to the plurality of ground straps.

15. A process chamber, comprising:
a chamber body having an interior volume therein;
a showerhead disposed in the interior volume to provide a process gas to the interior volume;
a substrate support disposed in the interior volume opposite the showerhead to support a substrate, wherein the substrate support is configured to move vertically from a first position to a second position, wherein the second position is closer to the showerhead than the first position;
a chamber liner coupled to the chamber body and disposed about the substrate support;
a confinement plate coupled to the chamber liner, wherein the confinement plate extends radially inward of an outermost surface of the substrate support;
a shield ring coupled to the substrate support and movable with the substrate support, wherein the shield ring extends radially outward from the substrate support toward the chamber liner such that the shield ring is movably disposed over the confinement plate, wherein a diameter of a central opening of the shield ring is greater than a diameter of a central opening of the confinement plate;
and a plurality of ground straps that are coupled to the shield ring at a first end and the confinement plate at a second end to maintain electrical connection between the substrate support and the chamber liner while the substrate support is in the first position and the second position.

16. The process chamber of claim 15, further comprising a plasma confinement ring disposed within the chamber liner proximate the showerhead to confine a plasma therein, wherein when in the second position, an inner wall of the shield ring is disposed within the plasma confinement ring.

17. The process chamber of claim 15, further comprising a lower liner coupled to the substrate support and disposed about the substrate support, wherein in the second position, the lower liner is disposed between the shield ring and the confinement plate, and wherein an outer diameter of the lower liner is less than an inner diameter of the shield ring.

18. The process chamber of claim 15, wherein in the first position, the substrate support is about 3.0 inches to about 5.0 inches from the showerhead, and wherein in the second position, the substrate support is about 0.2 inches to about 1.0 inches from the showerhead.

19. The process chamber of claim 15, wherein the confinement plate includes an inner portion having a plurality of inner radial slots and an outer portion having a plurality of outer radial slots, wherein the plurality of outer radial slots have lengths that vary.

20. The process chamber of claim 19, further comprising a pump port disposed in the chamber body on one side of the substrate support, wherein the plurality of outer radial slots of the confinement plate have lengths that are shorter proximate a side of the confinement plate proximate the pump port and lengths that are longer on a side of the confinement plate away from the pump port.

\* \* \* \* \*